United States Patent
Patel et al.

(10) Patent No.: US 10,304,956 B2
(45) Date of Patent: May 28, 2019

(54) DIFFUSED TIP EXTENSION TRANSISTOR

(71) Applicants: INTEL CORPORATION, Santa Clara, CA (US); Pratik A. Patel, Portland, OR (US); Mark Y. Liu, West Linn, OR (US); Jami A. Wiedemer, Beaverton, OR (US); Paul A. Packan, Beaverton, OR (US)

(72) Inventors: Pratik A. Patel, Portland, OR (US); Mark Y. Liu, West Linn, OR (US); Jami A. Wiedemer, Beaverton, OR (US); Paul A. Packan, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/038,969

(22) PCT Filed: Dec. 27, 2013

(86) PCT No.: PCT/US2013/078095
§ 371 (c)(1),
(2) Date: May 24, 2016

(87) PCT Pub. No.: WO2015/099782
PCT Pub. Date: Jul. 2, 2015

(65) Prior Publication Data
US 2016/0380102 A1    Dec. 29, 2016

(51) Int. Cl.
*H01L 29/08* (2006.01)
*H01L 29/24* (2006.01)
(Continued)

(52) U.S. Cl.
CPC ...... *H01L 29/7848* (2013.01); *H01L 21/2253* (2013.01); *H01L 21/324* (2013.01);
(Continued)

(58) Field of Classification Search
None
See application file for complete search history.

(56) References Cited

U.S. PATENT DOCUMENTS

| 5,710,450 A | 1/1998 | Chau et al. |
| 2008/0057668 A1* | 3/2008 | Okamura ............ H01L 21/84 438/424 |

(Continued)

FOREIGN PATENT DOCUMENTS

| TW | 201232780 | 8/2012 |
| TW | 201318032 | 5/2013 |
| WO | WO-2009040707 | 4/2009 |

OTHER PUBLICATIONS

Intel Corporation, Office Action, TW Application No. 103141011, (dated Feb. 26, 2016).
(Continued)

*Primary Examiner* — Moazzam Hossain
*Assistant Examiner* — Stanetta D Isaac
(74) *Attorney, Agent, or Firm* — Schwabe, Williamson & Wyatt, P.C.

(57) ABSTRACT

A method including forming an opening in a junction region of a fin on and extending from a substrate; introducing a doped semiconductor material in the opening; and thermal processing the doped semiconductor material. A method including forming a gate electrode on a fin extending from a substrate; forming openings in the fin adjacent opposite sides of the gate electrode; introducing a doped semiconductor material in the openings; and thermally processing the doped semiconductor material sufficient to induce the diffusion of a dopant in the doped semiconductor material. An apparatus including a gate electrode transversing a fin extending from a substrate; and semiconductor material filled openings in junction regions of the fin adjacent opposite sides of the gate electrode, wherein the semiconductor material comprises a dopant.

24 Claims, 4 Drawing Sheets

(51) Int. Cl.
*H01L 29/66* (2006.01)
*H01L 29/78* (2006.01)
*H01L 21/225* (2006.01)
*H01L 21/324* (2006.01)
*H01L 29/267* (2006.01)

(52) U.S. Cl.
CPC ......... *H01L 29/0847* (2013.01); *H01L 29/24* (2013.01); *H01L 29/267* (2013.01); *H01L 29/66492* (2013.01); *H01L 29/66636* (2013.01); *H01L 29/66795* (2013.01); *H01L 29/66803* (2013.01); *H01L 29/785* (2013.01); *H01L 29/7851* (2013.01)

(56) References Cited

U.S. PATENT DOCUMENTS

| | | |
|---|---|---|
| 2008/0283906 A1 | 11/2008 | Bohr |
| 2009/0162983 A1 | 6/2009 | Park et al. |
| 2011/0133164 A1 | 6/2011 | Bangsaruntip et al. |
| 2011/0147842 A1 | 6/2011 | Cappellani et al. |
| 2012/0138886 A1 | 6/2012 | Kuhn et al. |
| 2012/0161238 A1 | 6/2012 | Scheiper et al. |
| 2012/0171832 A1 | 7/2012 | Toh et al. |
| 2013/0193481 A1* | 8/2013 | Bryant .............. H01L 29/66742 257/192 |
| 2013/0200433 A1 | 8/2013 | Adam et al. |
| 2013/0277685 A1 | 10/2013 | Goto et al. |

OTHER PUBLICATIONS

Intel Corporation, et al., International search report and written opinion, International Application No. PCT/US2013/078095, (dated Sep. 26, 2014).

Intel Corporation, "International Preliminary Report on Patentability", International Application No. PCT/US2013/078095, (dated Jul. 7, 2016).

Extended European Search Report for European Patent No. 13900223.2 dated Jul. 19, 2017, 8 pgs.

Office Action from Chinese Patent Application No. 201380081241.7, dated Oct. 16, 2018, 9 pgs.

Office Action from Chinese Patent Application No. 201380081241.7, dated Mar. 25, 2019, 7pgs.

* cited by examiner

DIFFUSED TIP EXTENSION TRANSISTOR

CROSS-REFERENCE TO RELATED APPLICATION

This patent application is a U.S. National Phase Application under 35 U.S.C. § 371 of International Application No. PCT/US2013/078095, filed Dec. 27, 2013, entitled DIFFUSED TIP EXTENSION TRANSISTOR.

FIELD

Implants in field effect devices.

BACKGROUND

Source and drain junction regions of field effect transistors can be implanted with a shallow, extension source and drain regions to, for example, reduce punchthrough. Typical tip or extension formation in three-dimensional tri-gate field effect transistor structures involves the use of ion implantation of dopant (e.g., N-type dopant). Challenges associated with such implantation include resulting fin damage, achieving good uniformity or dopant concentration along a height of a fin and time and costs associated with the requirement of lithography patterning prior to such implantation.

DETAILED DESCRIPTION

Figure 1:
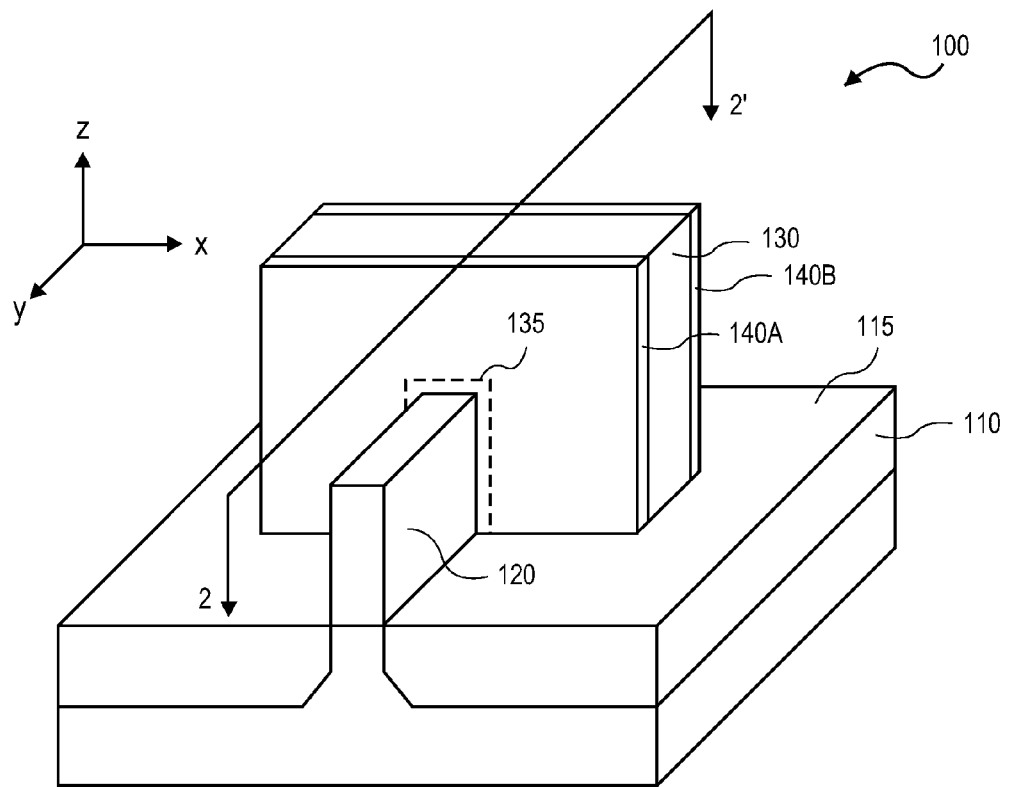
FIG. 1 is a top side perspective view of a three-dimensional tri-gate field effect transistor structure on a substrate.

FIG. 1 shows a top, side perspective view of a three-dimensional tri-gate field effect transistor structure. Structure 100 includes, in this embodiment single semiconductor fin 120 disposed on and extending in a z-direction from substrate 110. Structure 100 also includes gate electrode 130 transversing fin 120. Substrate 110 is, for example, a portion of semiconductor substrate, such as a silicon substrate or a silicon on insulator (SOI) structure. The portion illustrated includes only a single transistor structure. A larger portion may include a greater number of transistor structures ones of which may be connected (e.g., electrically connected) to form various circuits.

Fin 120 may be formed on a bulk silicon substrate (substrate 110) by, for example, masking some regions and epitaxially growing one or more fins on exposed areas. Alternatively, fin 120 may be etched in bulk silicon. Moreover, an SOI substrate may be used where one or more fins are etched in a monocrystalline film. It is appreciated that the orientation described is arbitrary. For purposes of explanation, it is assumed that fin 120 is disposed in a y-direction, gate electrode 130 is disposed in an x-direction and fin 120 extends in z-direction from substrate 110.

As illustrated in FIG. 1, in this embodiment, gate electrode 130 is formed on three sides of fin 120. In one embodiment, gate electrode 130 is a metal gate with a targeted work function for, for example, an N-type transistor. Disposed between gate electrode 130 and fin 120 is dielectric layer 135 of, for example, a dielectric material having a dielectric constant greater than a dielectric constant of silicon dioxide (a high-K dielectric). One way of forming a gate electrode on a fin is through a dummy gate process. In such process, a dummy gate of, for example, polysilicon is utilized to allow the processing of the structure prior to inclusion of a final gate such as a metal gate with a targeted work function. The following paragraphs describe processing of the fin. It is appreciated that such processing is accomplished, in one embodiment, with a dummy gate in place of gate electrode 130 or, in another embodiment, with gate electrode 130 in place.

Illustrated in FIG. 1 are sidewall spacers adjacent gate electrode 130. In one embodiment, sidewall spacers are a dielectric material of, for example, silicon dioxide or other dielectric material. Sidewall spacers 140A and 140B are disposed on opposite sides corresponding to sides associated with junction regions (source and drain regions, respectively) of fin 120.

Finally, referring to substrate 110, in one embodiment, the area (field) adjacent fin 120 may include dielectric material 115 such as silicon dioxide to isolate the fin and transistor structure. A dielectric such as silicon dioxide may be deposited or grown.

FIG. 1 shows a three dimensional or non-planar transistor structure including a fin and gate electrode each having vertical sidewalls relative to substrate 110 and planar surfaces. In other embodiments, sidewalls of transistor structures may not be vertical relative to a substrate and/or surfaces may not be planar, but may be less well defined such as sloped sidewalls or rounded edges. It is appreciated that manufacturing of such device structures will depend, at least in part, on the tooling available to the manufacturer and therefore the appearance of a manufactured structure may vary.

Figure 2:
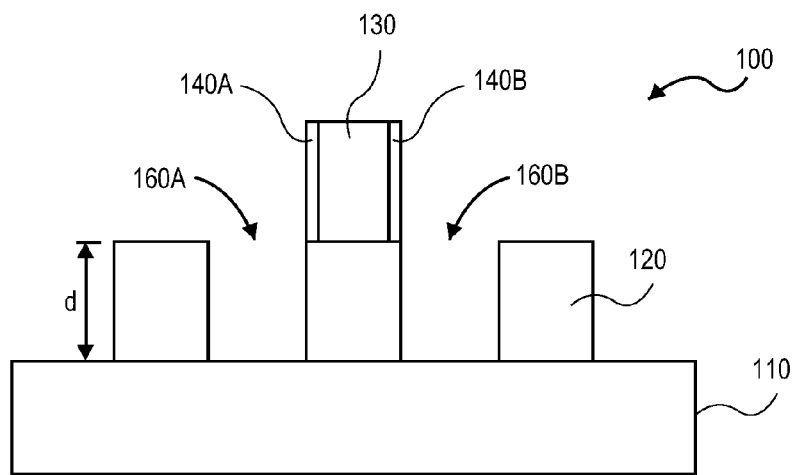
FIG. 2 is a cross-sectional side view of the structure of FIG. 1 through line 2-2'.
Figure 3:
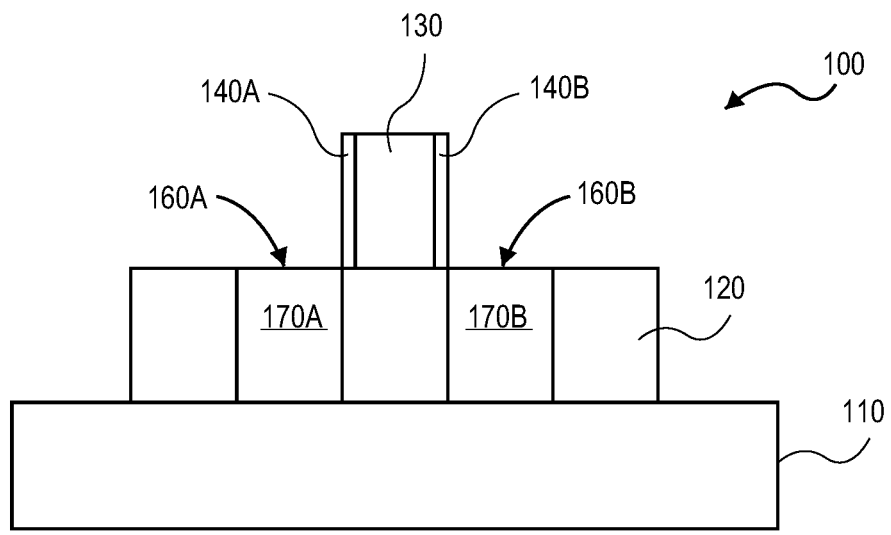
FIG. 3 shows the structure of FIG. 2 following the introduction of a doped semiconductor material.
Figure 4:
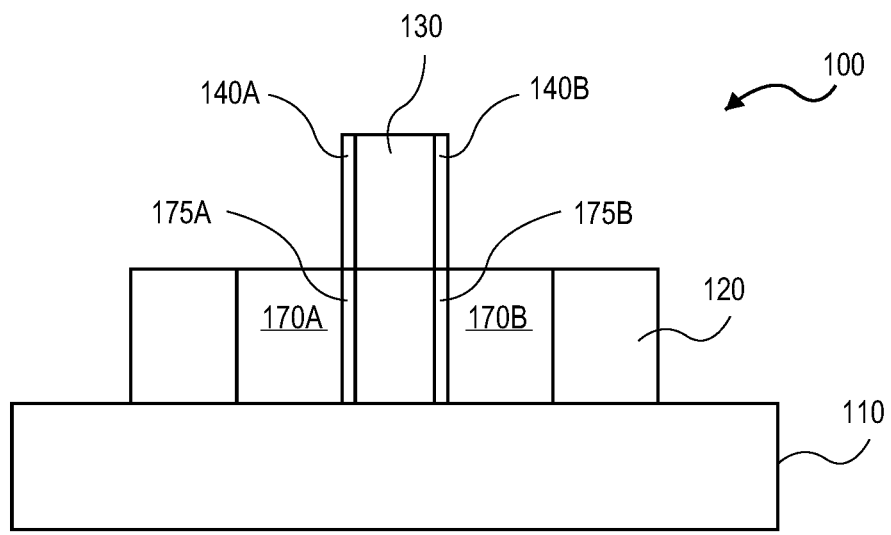
FIG. 4 shows the structure of FIG. 3 following the thermal processing of the doped semiconductor material introduced into the openings in the fin.
Figure 5:
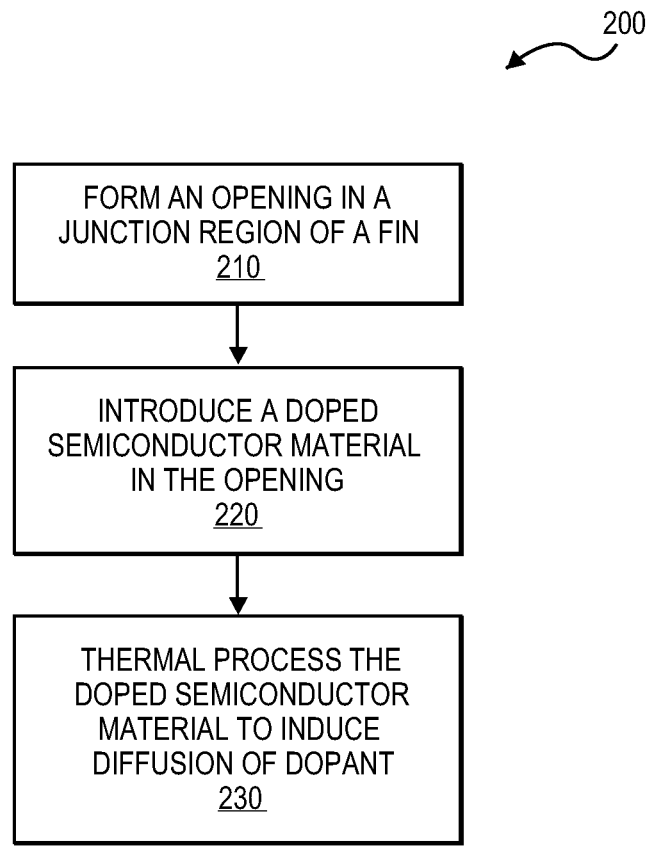
FIG. 5 is a flow chart describing such method.

In one embodiment, a method of forming junction regions (source and drain regions) for a tri-gate transistor structure such as the tri-gate transistor structure 100 of FIG. 1 is described. FIGS. 2-4 illustrate one embodiment of a method. FIG. 5 is a flow chart describing such method. Reference to FIGS. 2-5 will be made in the following paragraphs.

FIG. 2 shows a cross-sectional side view of structure 100 through lines 2-2' of FIG. 1. FIG. 2 shows fin 120 on and extending from substrate 110 and gate electrode 130 on fin 120. Disposed on opposite sides of gate electrode 130 is sidewall spacer 140A and sidewall spacer 140B, respectively. Sidewall spacer 140A and sidewall spacer 140B are disposed on sides of gate electrode 130 corresponding to source region and drain region, respectively, in fin 120. FIG. 2 shows the structure following the forming of openings in designated junction regions (source region, drain region) of fin 120 (FIG. 5, block 210). As illustrated in FIG. 2, the opening, in one embodiment, extends a height or depth, d, of the fin. In another embodiment, the opening extends a distance greater than a depth of fin 120 and thus into substrate 110. In another embodiment, the opening extends a distance less than a depth, d, of fin 120 (e.g., 75 percent of d, 80 percent of d). As illustrated in FIG. 2, opening 160A and opening 160B in fin 120 are aligned to sidewall spacer 140A and sidewall spacer 140B, respectively. In one embodiment, opening 160A and opening 160B in fin 120 are each formed by an anisotropic etch. Representatively, for a fin of a single crystal silicon, a suitable anisotropic etchant is an alkaline etchant (e.g., potassium hydroxide). Representatively, in one embodiment, prior to such etching of fin 120, areas excluding areas corresponding to opening 160A and opening 160B may be masked with a sacrificial material (e.g., a photoresist) to limit the etch area. In another embodiment, an etch may be selective for fin material (e.g., silicon) and no masking is necessary. Also, if a dummy gate is used for gate electrode 130.

FIG. 3 shows the structure of FIG. 2 following the introduction of a doped semiconductor material in each of opening 160A and opening 160B of fin 120 (FIG. 5, block 220). In one embodiment, the doped semiconductor material is doped for the desired transistor type (e.g., N-type, P-type). In one embodiment, the transistor structure 100 desired to be an N-type transistor. Accordingly, in such embodiment, the doped semiconductor is a phosphorous doped silicon. Representatively, for a silicon fin, the doped semiconductor material is the phosphorous doped epitaxy silicon. A representative dopant concentration (e.g., phosphorous concentration), in one embodiment, is on the order of at least $1 \times 10^{19}$ $cm^{-3}$. In one embodiment, the doping is done in situ in the sense that the dopant is incorporated during the growing/depositing.

FIG. 4 shows the structure of FIG. 3 following the thermal processing of the doped semiconductor material introduced into the openings in the fin (FIG. 5, block 230). In one embodiment, the concentration of dopant in the doped semiconductor material (doped semiconductor materials 170A and 170B) is sufficient such that a portion of the dopant may diffuse laterally in response to thermal processing. In this manner, such diffusion will form tip regions (tip region 175A and tip region 175B, respectively) that extends from the source region and the drain region of the transistor device toward the channel. In one embodiment, a concentration of dopant in tip region 175A and tip region 175B is less than a dopant concentration in junction regions 170A and 170B. A representative downstream thermal processing that provides such diffusion is on the order of 900° C. to 1000° C.

The above paragraphs describe a method for forming tip regions in a tri-gate structure without tip lithography layer or tip implants. Instead, an anisotropic etch is used to remove fin material in junction regions (source and drain regions) aligned to a gate spacer and, for an NMOS device, an NMOS epitaxy is grown in the etch opening which is aligned to the gate spacer. Tip regions are formed from a diffusion of dopants brought about, in one embodiment, by thermal processing of the semiconductor material introduced to the openings (e.g., downstream thermal processing). The result is limited damage to tip regions which results in improved performance. Another benefit is a uniform tip dopant concentration along the entire depth (height) of the fin as well as a cost benefit associated with eliminating a need for a tip lithography layer associated with a tip implant process.

Following the formation of tip regions in fin 120 of transistor structure shown 100 in FIG. 4, additional conventional processing may follow such as swapping a dummy gate for desired gate electrode material, isolating the device by the introduction of an insulating material on/over the structure and forming contacts to the structure.

Figure 6:
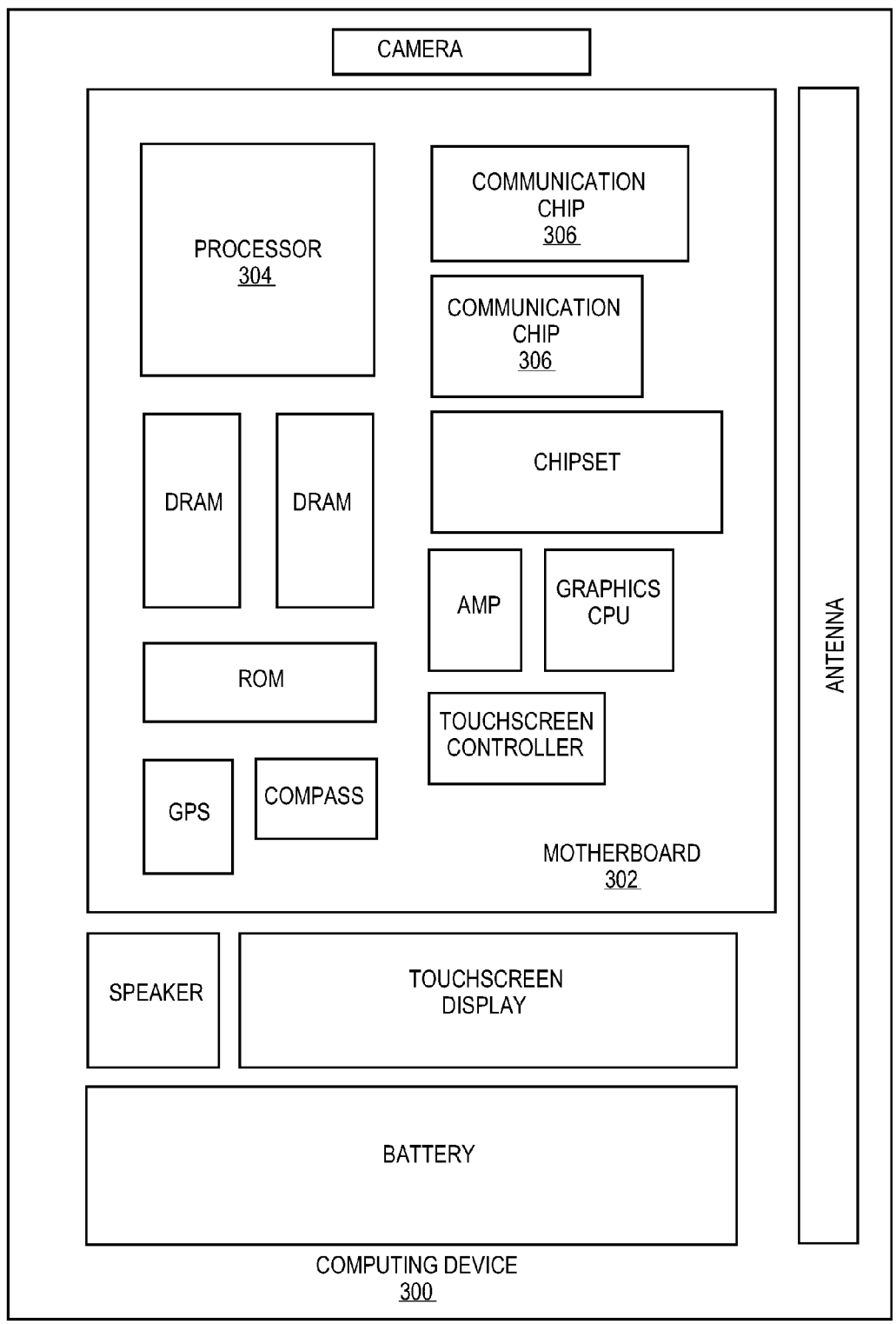
FIG. 6 illustrates computing device in accordance with one implementation of the invention.

FIG. 6 illustrates computing device 300 in accordance with one implementation. Computing device 300 houses board 302. Board 302 may include a number of components, including but not limited to processor 304 and at least one communication chip 306. Processor 304 is physically and electrically coupled to board 302. In some implementations at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, first communication chip 306 may be dedicated to shorter range wireless communications such as Wi-Fi and Bluetooth and second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations, the integrated circuit die of the processor includes one or more devices, such as transistors or metal interconnects, that are formed in accordance with implementations described including but not limited to NMOS transistors including an epitaxially introduced junction material and diffused tip. Such NMOS device, in one example, may be part of a complementary metal oxide semiconductor (CMOS). The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation, the integrated circuit die of the communication chip includes one or more devices, such as transistors (e.g., NMOS transistors), that are formed in accordance with implementations described above.

In further implementations, another component housed within computing device 300 may contain an integrated circuit die that includes one or more devices, such as transistors, that are formed in accordance with implementations described above.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

EXAMPLES

The following examples pertain to embodiments.

Example 1 is a method including forming an opening in a junction region of a fin on and extending from a substrate; introducing a doped semiconductor material in the opening; and thermal processing the doped semiconductor material.

In Example 2, the thermal processing in the method of Example 1 includes thermal processing sufficient to induce the diffusion of a dopant in the doped semiconductor material from the doped semiconductor material.

In Example 3, the opening in the junction region in the method of Example 1 includes a first opening corresponding to a source region and a second opening corresponding to a drain region.

In Example 4, a gate structure transverses the fin in the method of Example 1 and the source region and the drain region are disposed on opposite sides of the gate structure.

In Example 5, forming an opening in the method of Example 4 includes an aniostropic etch aligned to the gate electrode.

In Example 6, the gate electrode in the method of Example 5 includes a sidewall spacer on each of the opposite sides of the gate structure.

In Example 7, the doped semiconductor material in the method of Example 1 includes a N-type dopant.

In Example 8, the N-type dopant in the method of Example 7 is phosphorous at a concentration on the order of at least $1 \times 10^{19}$ cm−3.

In Example 9, forming the opening in the method of Example 1 includes forming an opening to a depth of the fin.

In Example 10, forming the opening in the method of Example 1 includes forming an opening that extends a distance greater than a depth of the fin.

In Example 11, forming the opening in the method of Example 1 includes forming an opening that extends a distance less than a depth of the fin.

Example 12 is a method including forming a gate electrode on a fin extending from a substrate; forming openings in the fin adjacent opposite sides of the gate electrode; introducing a doped semiconductor material in the openings; and thermally processing the doped semiconductor material sufficient to induce the diffusion of a dopant in the doped semiconductor material.

In Example 13 forming the gate electrode in the method of Example 12 includes forming a sidewall spacer on each of the oppose sides of the gate electrode.

In Example 14, forming the opening in the method of Example 13 includes an anisotropic etch aligned to the gate electrode.

In Example 15, forming openings in the method of Example 12 includes forming openings to a depth of the fin.

In Example 16, forming openings in the method of Example 12 includes forming openings that extend a distance greater than a depth of the fin.

In Example 17, forming openings in the method of Example 12 includes forming openings that extend a distance less than a depth of the fin.

In Example 18, the doped semiconductor material in the method of Example 12 includes a N-type dopant.

In Example 19, the N-type dopant in the method of Example 18 includes phosphorous at a concentration on the order of at least $1 \times 10^{19}$ cm−3.

Example 20 is an apparatus including a gate electrode transversing a fin extending from a substrate and semiconductor material filled openings in junction regions of the fin adjacent opposite sides of the gate electrode, wherein the semiconductor material comprises a dopant.

In Example 21, the apparatus of Example 20 further includes a sidewall spacer on each side of the opposite sides of the gate electrode.

In Example 22, a portion of the fin underlying the sidewall spacer in the apparatus of Example 21 includes a dopant at a concentration less than a concentration of the semiconductor filled openings In Example 23, the dopant in the apparatus of Example 20 includes an N-type dopant.

In Example 24, the semiconductor filled openings in the apparatus of Example 20 extend a depth of the fin.

In Example 25, the semiconductor filled openings in the apparatus of Example 20 extend a distance greater than a depth of the fin.

In Example 26, the semiconductor filled openings in the apparatus of Example 20 extend a distance less than a depth of the fin.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
forming an opening in a first junction region and a second junction region of a fin on and extending from a substrate, wherein the first junction region and the second junction region are separated by a channel;

introducing a doped semiconductor material in the opening of each of the first junction region and the second junction region; and thermal processing the doped semiconductor material, sufficient to cause diffusion of dopants from doped semiconductor material into the channel to form a tip region adjacent each of the first junction region and the second junction region, wherein each tip region has a same tip dopant concentration at a bottom of the fin, at a top of the fin, and along a height of the fin between the bottom of the fin and the top of the fin.

2. The method of claim 1, wherein the thermal processing comprises thermal processing sufficient to induce the diffusion of a dopant in the doped semiconductor material from the doped semiconductor material.

3. The method of claim 1, wherein the opening in the junction region comprises a first opening corresponding to a source region and a second opening corresponding to a drain region.

4. The method of claim 3, wherein a gate structure transverses the fin and the source region and the drain region are disposed on opposite sides of the gate structure.

5. The method of claim 4, wherein forming an opening comprises an anisotropic etch aligned to the gate electrode.

6. The method of claim 5, wherein the gate electrode comprises a sidewall spacer on each of the opposite sides of the gate structure.

7. The method of claim 1, wherein the doped semiconductor material comprises a N-type dopant.

8. The method of claim 7, wherein the N-type dopant is phosphorous at a concentration on the order of at least $1 \times 10^{19}$ cm$^{-3}$.

9. The method of claim 1, wherein forming the opening comprises forming an opening to a depth of the fin.

10. The method of claim 1, wherein forming the opening comprises forming an opening that extends a distance greater than a depth of the fin.

11. The method of claim 1, wherein forming the opening comprises forming an opening that extends a distance less than a depth of the fin.

12. A method comprising:
forming a gate electrode on a fin extending from a substrate;

forming openings in the fin adjacent opposite sides of the gate electrode; introducing a doped semiconductor material in the openings; and thermally processing the doped semiconductor material sufficient to induce the diffusion of a dopant in the doped semiconductor material into the fin to form tip regions, wherein each tip region has a same tip dopant concentration at a bottom of the fin, at a top of the fin, and along a height of the fin between the bottom of the fin and the top of the fin.

13. The method of claim 12, wherein forming the gate electrode comprises forming a sidewall spacer on each of the oppose sides of the gate electrode.

14. The method of claim 13, wherein forming the opening comprises an anisotropic etch aligned to the gate electrode.

15. The method of claim 12, wherein forming openings comprises forming openings to a depth of the fin.

16. The method of claim 12, wherein forming openings comprises forming openings that extend a distance greater than a depth of the fin.

17. The method of claim 12, wherein forming openings comprises forming openings that extend a distance less than a depth of the fin.

18. The method of claim 12, wherein the doped semiconductor material comprises a N-type dopant.

19. The method of claim 18, wherein the N-type dopant comprises phosphorous at a concentration on the order of at least $1 \times 10^{19}$ cm$^{-3}$.

20. An apparatus comprising:
a gate electrode transversing a fin extending from a substrate;

semiconductor material filled openings injunction regions of the fin adjacent opposite sides of the gate electrode, wherein the semiconductor material comprises a dopant; and a sidewall spacer on each side of the opposite sides of the gate electrode, wherein a portion of the fin underlying the sidewall spacer comprises a dopant at a concentration less than a concentration of the semiconductor filled openings in the junction regions, wherein the portion of the fin has a same dopant concentration at a bottom of the fin, at a top of the fin, and along a height of the fin between the bottom of the fin and the top of the fin.

21. The apparatus of claim 20, wherein the dopant comprises an N-type dopant.

22. The apparatus of claim 20, wherein the semiconductor filled openings extend a depth of the fin.

23. The apparatus of claim 20, wherein the semiconductor filled openings extend a distance greater than depth of the fin.

24. The apparatus of claim 20, wherein the semiconductor filled openings extend a distance less than a depth of the fin.

* * * * *